United States Patent [19]
Kishi et al.

[11] Patent Number: 6,084,172
[45] Date of Patent: Jul. 4, 2000

[54] THERMOELECTRIC CONVERSION COMPONENT

[75] Inventors: Matsuo Kishi; Minao Yamamoto; Yoshifumi Yoshida, all of Chiba, Japan

[73] Assignee: Seiko Instruments R&D Center Inc., Japan

[21] Appl. No.: 09/047,860

[22] Filed: Mar. 25, 1998

[30] Foreign Application Priority Data

Mar. 27, 1997 [JP] Japan ................................. 9-076282

[51] Int. Cl.$^7$ .................................................. H01L 35/00
[52] U.S. Cl. .......................... 136/200; 136/203; 136/205; 136/242; 62/3.2
[58] Field of Search .................................... 136/203, 205, 136/242; 62/3.2, 3.3, 3.4, 3.5, 3.6, 3.7; 374/179, 182, 204

[56] References Cited

U.S. PATENT DOCUMENTS

| | | | |
|---|---|---|---|
| 5,522,225 | 6/1996 | Eskandari | 62/3.7 |
| 5,594,609 | 1/1997 | Lin | 136/225 |

*Primary Examiner*—Kathryn Gorgos
*Assistant Examiner*—Thomas H Parsons
*Attorney, Agent, or Firm*—Adams & Wilks

[57] ABSTRACT

A π-type thermoelectric conversion component detects and controls temperature and at the same time exhibits a cooling performance inherently possessed by the thermoelectric conversion component without the need for mounting a discrete temperature detecting unit. To achieve this, a temperature detecting unit, such as a thin film thermistor or doped semiconductor region, is directly integrated on a surface of a substrate forming the thermoelectric component. In one embodiment, a monocrystalline silicon wafer is used as at least one of the opposing substrates of the thermoelectric conversion component, a temperature detecting unit having a diffused resistor is formed therein. An electrode of the temperature detecting unit is connected to an electrode formed on the opposing substrate to reduce the thermal load. There is thus no need for mounting a discrete temperature detecting unit, which places a thermal load on the thermoelectric conversion component, and it is thus possible to perform temperature detection from the same substrate to which a power supply of the thermoelectric conversion component is applied. It is also possible to obtain a cooling performance inherently possessed by the thermoelectric conversion component without the need to increase the performance criteria of the device to incorporate a temperature detecting unit.

23 Claims, 14 Drawing Sheets

THERMOELECTRIC CONVERSION COMPONENT

BACKGROUND OF THE INVENTION

The present invention relates to a thermoelectric conversion component adapted to perform cooling and heat generation by means of the Peltier effect as well as thermal power generation by means of the Seebeck effect.

A thermoelectric conversion component (although it is referred to also as a Peltier component or an electronic cooling device, etc., it is called so in the meaning of including them) is generally constituted by a p-type thermoelectric material chip and an n-type thermoelectric material chip sandwiched between two substrates so that the p-type thermoelectric material chip and the n-type thermoelectric chip are placed in a pn junction through a conductive substance such as a metal.

The conventional thermoelectric conversion component as mentioned above has a temperature detecting unit such as a thermistor or the like mounted on the substrate by adhesion or the like so that input/output electrodes of the temperature detecting unit are connected to an external control device through lead wires or the like, in order to detect and control the temperature of the two substrates.

The conventional thermoelectric conversion components described above have required mounting of a temperature detecting unit, such as a thermistor, etc. on the substrate in order to perform accurate detection and control of temperatures. This necessitates the provision of a space or area for mounting the temperature detecting unit on the substrate of the thermoelectric conversion component. At the same time, consideration has to be given to the influence of a thermal capacity of the temperature detecting unit. There has been a problem in that the thermoelectric conversion component requires a performance specification that is higher than that inherently required. Further, where the thermoelectric conversion component is used as a cooling component, an input electrode therefor is provided on a substrate of a heat radiating side in order not to become a load against cooling. Meanwhile, the temperature detecting unit such as a thermistor is generally attached to the substrate of the cooling side. In such a case, there has been a problem that external heat comes by conduction through lead wires connecting between the temperature detecting unit and an external control device, thereby increasing the load against cooling.

Further, since the structure like this requires a complicated process of connecting between the temperature detecting unit and the external control device, and also connecting between cubic structural bodies during so-called mounting process. It is therefore difficult to say, for the conventional thermoelectric conversion component, to be preferable also in respect of cost and yield.

The above-mentioned problem is prominent particularly for a small-sized thermoelectric conversion component. For example, a semiconductor laser utilized for optical communications requires cooling by a thermoelectric conversion component, because it generates heat. However, since the thermoelectric conversion component is small in size, i.e. a several-mm square, the mounting of a sensor or the like for temperature control has great influence on the size and cooling performances. Accordingly, there has been a problem in respect of reducing, as a whole, the size and the power consumption.

SUMMARY OF THE INVENTION

It is therefore an object of the present invention to realize a thermoelectric conversion component which is capable of detecting and controlling temperatures with high capacity and efficiency of cooling.

The thermoelectric conversion component of the present invention has a temperature detecting unit (temperature sensor) formed in at least one of two substrates constituting the thermoelectric conversion component. This makes it unnecessary to mount parts for detecting temperatures.

Further, the surface having the temperature detecting unit is arranged on a surface to which elements in the thermoelectric conversion component are jointed. This enables an input/output electrode to be directly formed by a conductive substance, that is, the same material as the thermoelectric elements used as the thermoelectric conversion component. Through this input/output electrode, a connection is performed between the substrate formed with the temperature detecting unit and an electrode on the opposite substrate. This makes it possible to input and output through the substrate placed opposite to the substrate formed with the temperature detecting unit. It is therefore possible to reduce a thermal load applied to a temperature controlling surface of the thermoelectric conversion component.

Where a thermistor is adopted as a temperature detecting unit, it can be made by a thin film or thick film and integrated with the substrate. At the same time, input/output electrodes can be connected by a thermoelectric material between the two substrates constituting the thermoelectric conversion component.

Where at least one of the substrates constituting the thermoelectric conversion component is a silicon having an insulating layer on its surface and the temperature detecting unit operates on the basis of a semiconductor characteristic of the silicon, the temperature detecting unit can be integrated with the substrate. Further, even if the thermoelectric conversion component is small in size, the input/output electrodes can be connected between the two substrates constituting the component by applying a semiconductor technique.

PREFERRED EMBODIMENT OF THE INVENTION

Figure 1:
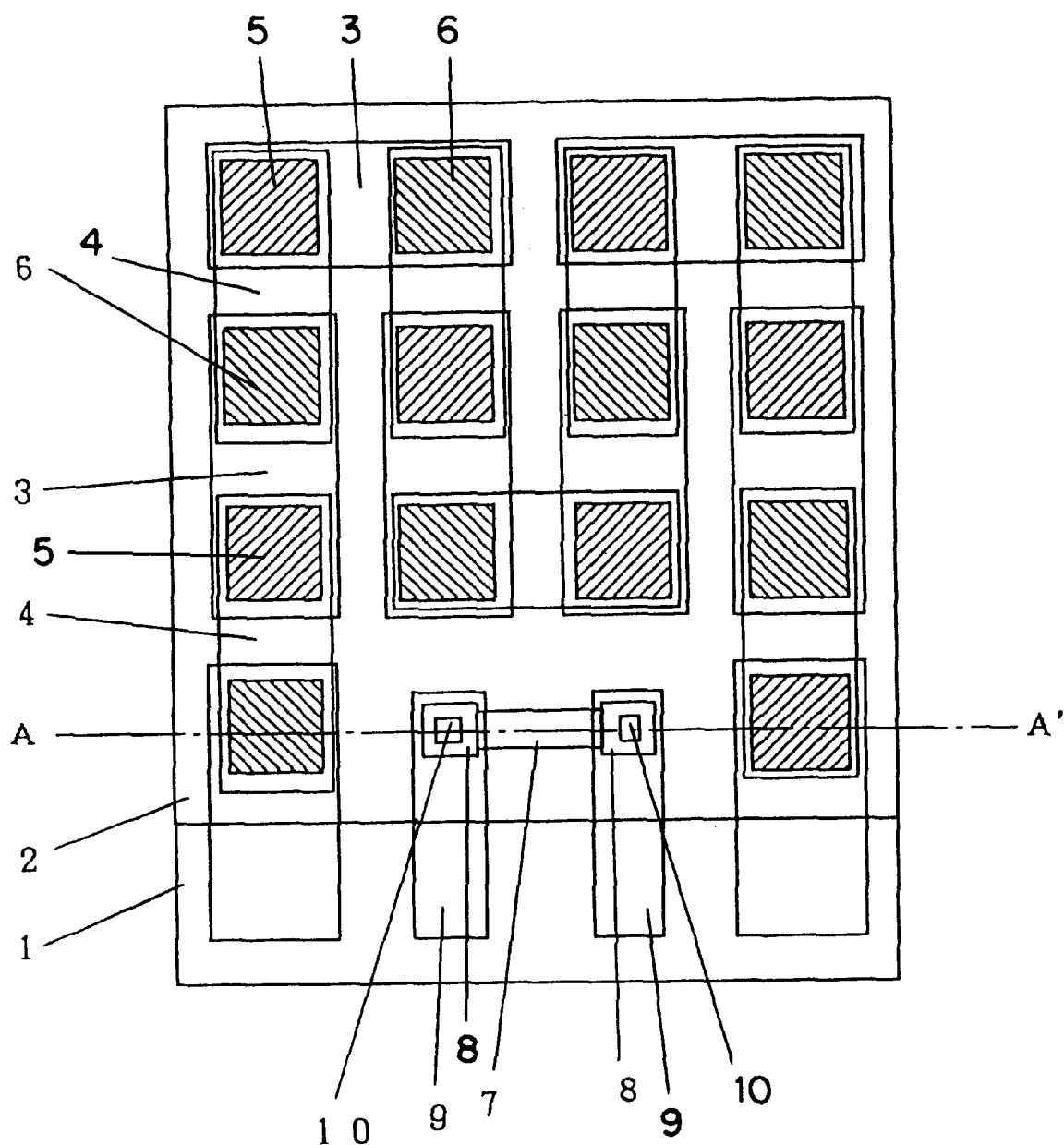
FIG. 1 is a view seen-through, from the above of a substrate, showing a positional relationship between principal parts of a thermoelectric conversion component of the present invention.

In an embodiment according to the present invention, a temperature detecting unit is formed in a surface, to which thermoelectric elements are connected, of at least one of two substrates constituting a thermoelectric conversion component. This temperature detecting unit is formed by a thin-film technique or a semiconductor technique, etc. Further, this thermoelectric conversion component can be manufactured as a component by forming a temperature detecting unit on a substrate and then being joined by thermoelectric elements. This enables the temperature detecting unit to be formed in the same plane as those of thermoelectric elements jointing electrodes. Therefore, the manufacturing process is applied only on one surface of the substrate, and this is favorable in respect of operation, etc. as compared to a case where the temperature detecting unit is formed on the opposite surface of the substrate.

Further, since the substrate and the temperature detecting unit are integrated, there is no necessity for mounting a temperature detecting unit, such as a thermistor supplied as a chip component, on the substrate constituting the thermoelectric conversion component. It is therefore possible to eliminate the above-mentioned problem, that is, problem that the thermoelectric conversion component is made unnecessarily large or it has to be formed with excessive performance criteria.

Moreover, a conductive substance is used to connect between an input/output electrode directly formed on the temperature detecting unit and an electrode formed on the other substrate opposite to a substrate formed with the temperature detecting unit.

This makes it possible to perform signal input/output concerning temperature detection through the substrate opposite to the substrate formed with the temperature detecting unit. This therefore eliminates the necessity of directly connecting the temperature detecting unit to the outside at a temperature controlling surface of the thermoelectric conversion component requiring a temperature detector. It is thus possible to obtain an electrical connection to the outside through only one of the substrates (the substrate formed with an electrode for supplying power as a thermoelectric conversion of the thermoelectric conversion component). Further, a thermal load applied to the temperature controlling surface can be reduced by appropriately designing the material, the size, etc. of a connecting material.

Further, the material used as the thermoelectric material constituting the thermoelectric elements is also used to connect between the input/output electrode directly formed on the temperature detecting unit and the electrode formed on the other substrate opposite to the substrate formed with the temperature detecting unit.

Due to this, the thermoelectric material for performing the connection between the electrodes is a substance having one of the lowest thermal conductivity levels among conductive substances, so that when the temperature detecting unit is connected to the outside, a heat transfer can be decreased as compared to a metal, such as gold wire, used in general. Therefore, the thermal load applied to the temperature controlling surface can be reduced.

Further, by adopting this structure, since the thermoelectric material for connection can also be simultaneously connected when the thermoelectric elements are joined advantages in respect of operation, cost, etc. are obtained.

Further, the thermoelectric material for performing the connection between the input/output electrode directly formed on the temperature detecting unit and the electrode formed on the other substrate opposite to the substrate formed with the temperature detecting unit is electrically insulated from the thermoelectric elements used as the thermoelectric conversion component.

Moreover, in the event that a plurality of the thermoelectric materials are used for performing the connection between the input/output electrode directly formed on the temperature detecting unit and the electrode formed on the other substrate opposite to the substrate formed with the temperature detecting unit, these thermoelectric materials are all made in the same semiconductor type (p-type and n-type).

In the event that there is a difference in the material connecting the electrodes between the substrates, a thermo-electromotive force occurs due to a temperature difference between the substrates during operation of the component. However, the use of the thermoelectric material of the same type will not generate a thermoelectromotive force even if a temperature difference occurs during operation of the device, thereby giving no influence on temperature measurements.

Further, by adopting this structure, the connecting thermoelectric material can be connected simultaneously with the connection of the thermoelectric elements, thereby giving advantages in an aspect of manufacture, such as operation, cost or the like.

Moreover, the thermoelectric material used for joining the electrodes is made in the same size, shape, etc. as the thermoelectric elements.

This allows the thermoelectric material used for this connection to be simultaneously made during a process of forming the thermoelectric elements. At the same time, the electrodes can be connected by the connecting thermoelectric material, thereby providing advantages in terms of operation, cost and the like.

Further, the temperature detecting unit integrally formed on the substrate of the thermoelectric conversion component is constituted by a thermistor. This enables the fabrication of the temperature detecting unit on an alumina substrate broadly used for substrates of the thermoelectric conversion component. Generally, a thermistor uses a composite substance of a metal and a ceramic, such as Ta—$SiO_2$, or semiconductor. Since the thermistor can be made by forming a thin film on an insulating substrate such as alumina by means of sputtering or the like and then processing it to a required shape by etching, etc. or by means of making a pasty material into a desired shape by printing, etc. and then sintering it, the thermistor can easily be fabricated integrally on the substrate in the thermoelectric conversion component.

Further, a silicon substrate may be used as the substrates for constituting the thermoelectric conversion component. In this case, a semiconductor characteristic versus temperature possessed by the silicon can be used as a temperature detecting means of the temperature detecting unit in the thermoelectric conversion component. For example, by appropriately doping an impurity into a vicinity of silicon's surface, a resistivity of the silicon largely varies with respect to a temperature change. By forming such a region in a part of the substrate, a thermoelectric conversion component can be manufactured.

This thermoelectric conversion component is extremely small in size, wherein several tens to several hundreds of thermoelectric material chips are joined onto substrates of a several-mm square. However, where the substrates are constituted by silicon, it is possible to manufacture a number of thermoelectric conversion components from one substrate by using such a method of producing a thermoelectric conversion component as described in Japanese Unexamined Patent Publication No. H8-97472. At the same time, where a temperature sensor is fabricated when the silicon substrate is formed, a thermoelectric conversion component having a temperature detecting unit can be provided easily and at low cost.

(Embodiment 1)

Figure 2:
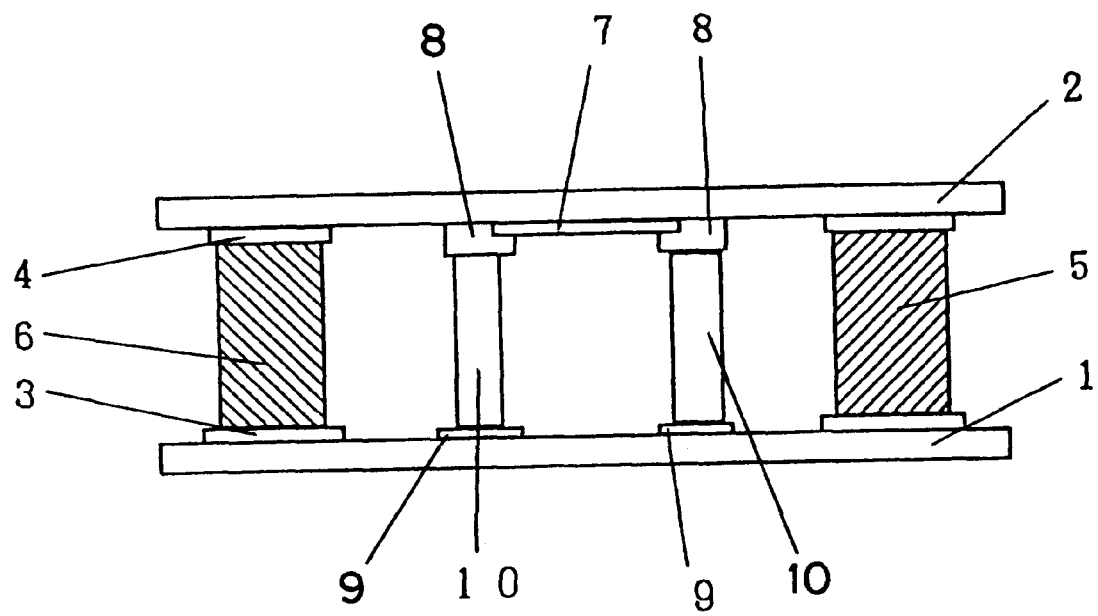
FIG. 2 is a sectional view taken along a broken line A–A' in FIG. 1.

FIG. 1 is a view showing a positional relationship between various parts taken in a plane parallel to a surface of a substrate, i.e. arrangement of principal parts as seen-through from an upper surface of the substrate, of a thermoelectric conversion component according to the present invention. Further, FIG. 2 is a sectional view taken along a broken line A–A' in FIG. 1. In these figures, the thermoelectric conversion component has a basic structure similar to one which is called a conventional π-type component. That is, the component is constituted by lower pn jointing electrodes 3 and upper pn jointing electrodes 4 respectively formed on a lower substrate 1 and an upper substrate 2, and p-type elements 5 formed of a p-type Bi—Te based thermoelectric material chip and n-type elements 6 formed of an n-type Bi—Te based thermoelectric material chip. Incidentally, for convenience' sake the substrates are defined here as the upper substrate and the lower substrate in order to facilitate explanation, though there is no substantial difference between both. In the present embodiment, the upper substrate 2 is formed with a thermistor 7, in addition to a basic structure of such a π-type thermoelectric conversion component as mentioned above, and the thermistor 7, thermistor-resistance measuring electrodes 8 formed on the thermistor 7 are connected through connecting conductors 10 to temperature detection output withdrawing electrodes 9 formed on the lower substrate 1.

Now, a concrete process for manufacturing a thermoelectric conversion component having such a constitution/structure as mentioned above will be described below. First, there was prepared an alumina substrate having a high thermal conductivity, which was directly jointed at one surface with a copper electrode plated with nickel. An SiC thin film which is a thin film thermistor material (NTC as characteristics) is formed by sputtering on the substrate surface jointed with the electrode. The sputtering was performed with a metal-mask masking such that the SiC film ensures a shape as a thermistor. In this manner, a thermistor 7 shown in FIG. 1 and FIG. 2 was formed. Then, electrodes 8 consisting of Cr, Ni and Au were formed by sputtering with the metal-mask masking, similarly to the formation of the SiC film. Incidentally, the thermistor made here had characteristics determined of R=15 kΩ and B constant=4100 K at 25° C.

Between the substrate having the electrodes formed with the thin-film thermistor and the opposite substrate merely formed with the electrodes, p-type elements 5 and n-type elements 6 were sandwiched and jointed by soldering, wherein each of these elements has a size of 0.6 mm×0.6 mm with 1 mm in height and consists of a Bi—Te based thermoelectric material. A thermoelectric conversion component was manufactured, which finally had 7 pairs of pn junctions (number of elements=14) in a substrate having an outer size of 4.5 mm ×4.5 mm with an overall thickness of 2.3 mm. Also the copper-made connecting conductors 10 were connected simultaneously with the jointing of the thermoelectric material elements by soldering. In this manner, a thermoelectric conversion component of the present invention was manufactured, which has such a structure that a thermistor as a temperature detecting unit is formed in an integrated form on a thermoelectric material element jointing surface of one substrate and moreover electrodes of the thermistor are connected to the other substrate opposite to the former substrate.

The thermoelectric conversion component thus manufactured was examined with respect to cooling characteristics in a vacuum by making the substrate having the thermistor 7 into a cooling side and attaching a heat radiating plate to the opposite substrate. In this case, the measurement of temperature was made by utilizing the electrodes 9 connected to the thermistor 7. When an electric current was supplied to the thermoelectric conversion component while sufficiently radiating heat so as to keep the temperature on the heat radiating a side constantly at 30° C., the temperature value exhibited by the thermistor 7 on the cooling side decreased with an increase in the current value, and when the current value was 1.2 A, a minimum temperature of −36° C. (ΔT=66° C.) was exhibited. Thereafter when the current value was further increased, the generation of Joule's heat due to current supply became predominant and the temperature value exhibited by the thermistor 7 gradually increased.

On the other hand, as a comparison, a performance evaluation was similarly made by adhering a chip-like thermistor (about 2 mm×3 mm×1 mm t)onto a conventional-type thermoelectric conversion component of the same type (in size, and the number of pn junctions) as the presently described embodiment and connecting the thermistor to external measuring equipment through a lead line wires, and when the electric current supplied to the thermoelectric conversion component was at 1.2 A, a minimum temperature of −32° C. (ΔT=62° C.) was exhibited.

Figure 3:
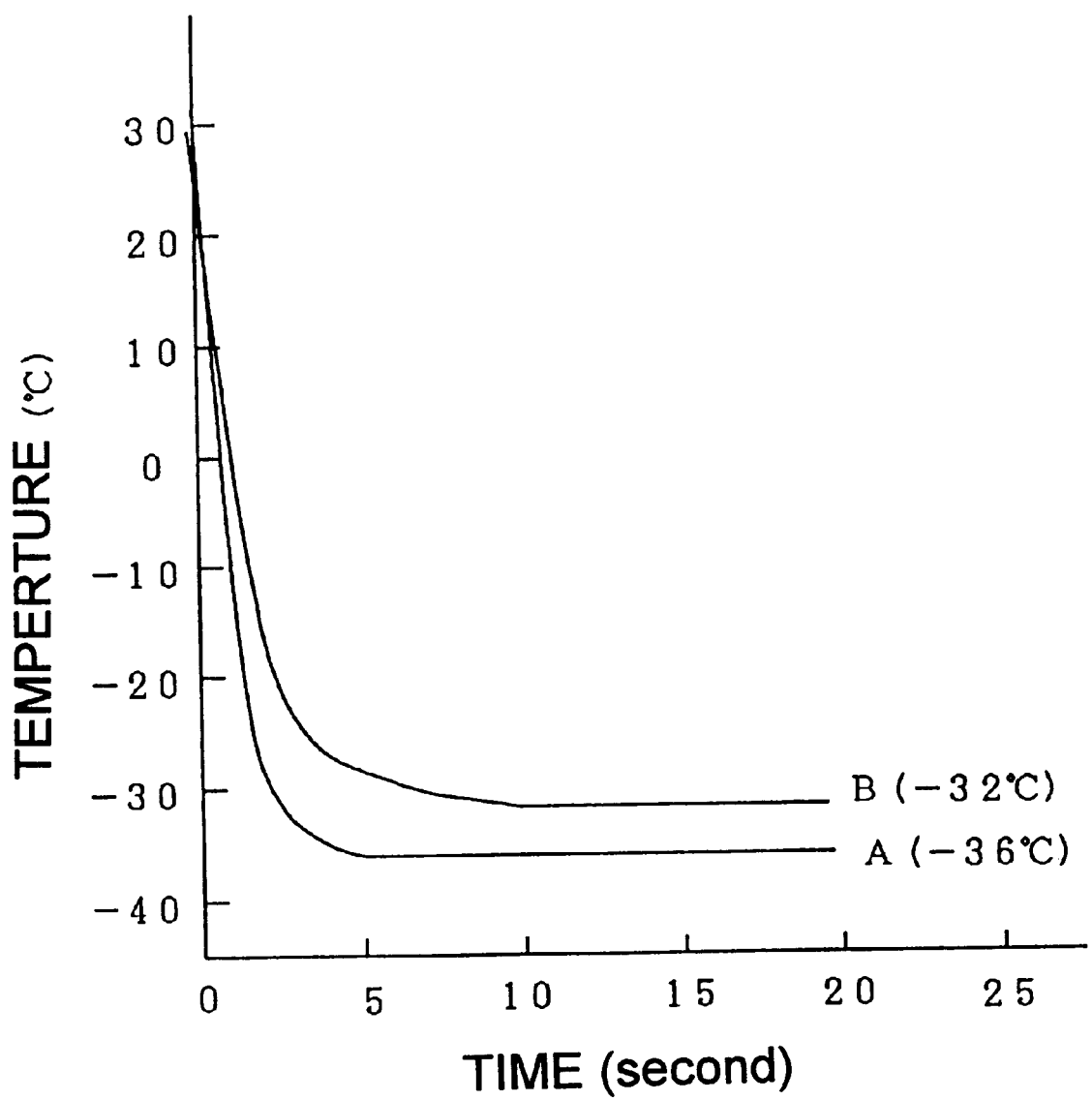
FIG. 3 is a graph showing a result of measurements on temperatures versus time period of current supply for the thermoelectric conversion component of the present invention and a conventional-type thermoelectric conversion component.

In order to further compare the cooling performances of these two thermoelectric conversion components (the thermoelectric conversion component of the present invention and the conventional-type thermoelectric conversion component manufactured for comparison), the current value of 1.2 A exhibiting a maximum temperature difference was supplied. FIG. 3 shows the temperatures exhibited by these thermistors with respect to time change. In a curve B exhibiting a cooling characteristic of the conventional-type thermoelectric conversion component in which a thermistor part has been mounted by adhesion, about 10 seconds is required until a maximum temperature difference of ΔT=62° C. will be exhibited. On the contrary, in the thermoelectric conversion component in which the thin-film thermistor is directly formed on the substrate according to the present invention, the time required until a maximum temperature difference of $\Delta T=66°$ C. will be exhibited is about 5 seconds, as shown by a curve A.

As stated above, the thermoelectric conversion component of the present invention is superior in the maximum temperature difference by 4° C. as compared to the conventional-type thermoelectric conversion component in which a chip-like thermistor has been mounted by adhesion, and also the time required until the maximum temperature difference will be obtained becomes about ½ of that required in the conventional device, so that it has a very excellent performance.

Incidentally, in the thermoelectric conversion component of the presently described embodiment, the thermistor, which is a temperature detecting unit was formed on one substrate, but where the temperature of the two substrates constituting the thermoelectric conversion component is monitored and controlled, all of the electric connections can be performed by the one substrate by means of forming the temperature detecting unit on both substrates, making input/output electrodes of one temperature detecting unit into the structure of the present embodiment and forming input/output electrodes of the temperature detecting unit formed on the other substrate on that substrate.

(Embodiment 2)

In embodiment 2, there will be described an example in which the present invention is applied to a ultra-small thermoelectric conversion component. In this thermoelectric conversion component, a thermoelectric material constituting the thermoelectric conversion component is a Bi—Te based sintered material, the size of each element is 120 $\mu m \times 120 \mu m$ with a height (thickness) of 600 $\mu m$, the number of elements is 102 (number of pn junctions=51 pairs) and an outer size of the component is 3 mm×3 mm with a thickness of about 1.3 mm.

It is very difficult to manufacture the ultra-small thermoelectric conversion component like this by a method of sandwiching the elements between the substrates by means of using a jig, etc. like a conventional method, and it is not too much to say that it is impossible. In this embodiment, therefore, a silicon wafer was used for the substrates constituting the component and there was manufactured the thermoelectric conversion component in which a temperature detecting unit was integrated by means of forming the electrodes, etc. on the substrate by a thin-film forming technique, which is one of micro working techniques, and a photolithography technique and simultaneously utilizing semiconductor characteristics possessed by a silicon which is the substrate. That is, the temperature detecting unit is constituted by means of utilizing temperature characteristics of a diffusion resistance formed by appropriately diffusing an impurity into the silicon substrate. This temperature detecting unit and the thermoelectric conversion component will be explained below on the basis of an embodiment.

Figure 4:
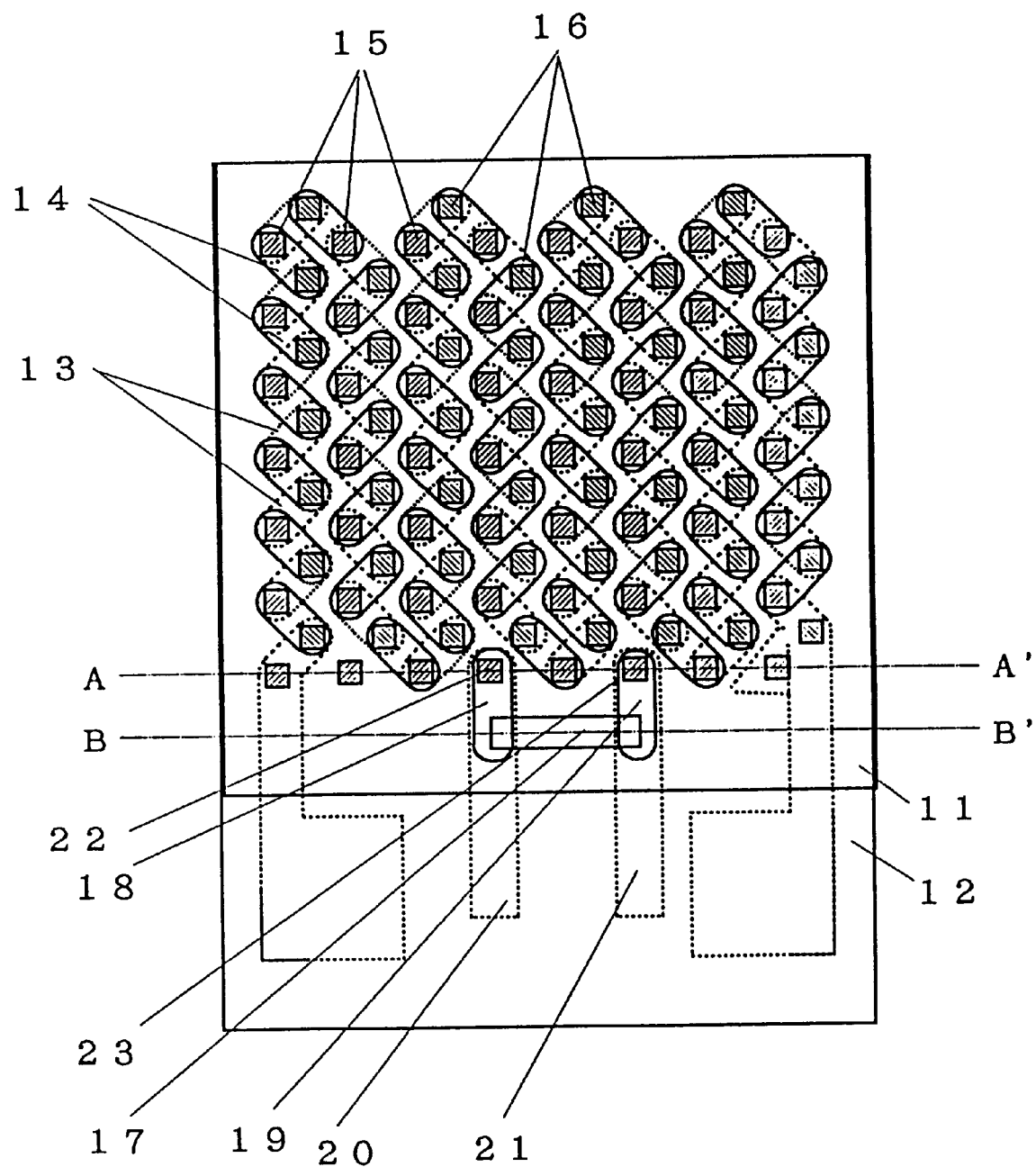
FIG. 4 is a view seen-through, from the above of a substrate, showing a positional relationship between principal parts of a thermoelectric conversion component according to a second embodiment of the present invention.
Figure 5:
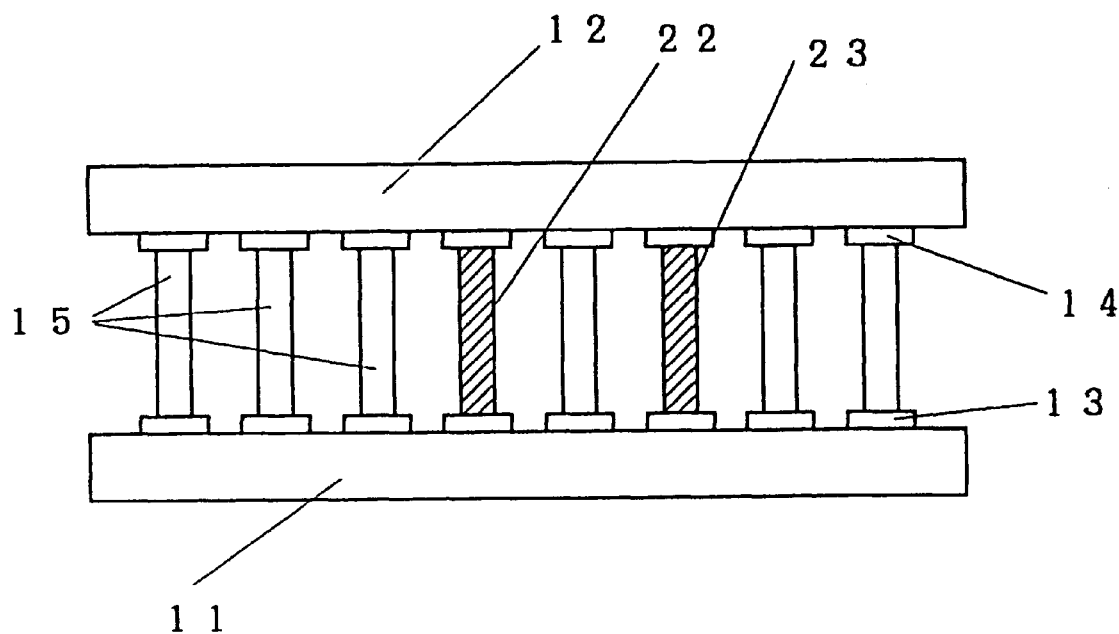
FIG. 5 is a sectional view showing a longitudinal section taken along a broken line A–A ' shown in FIG. 4.
Figure 6:
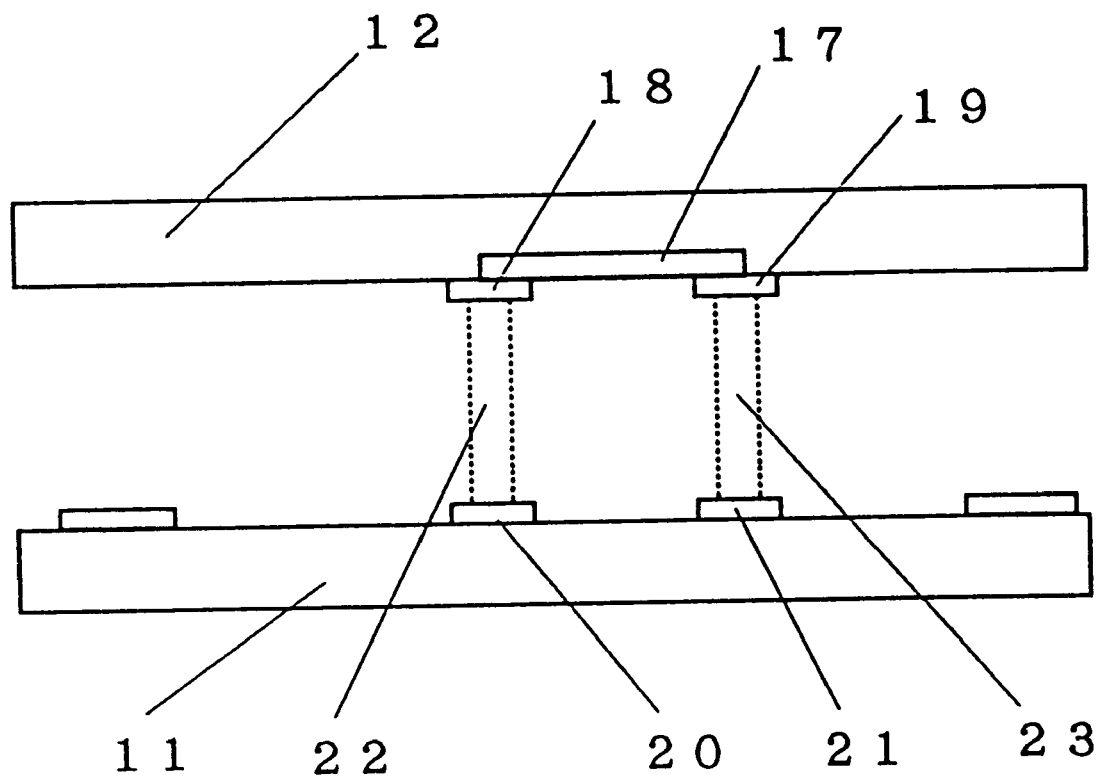
FIG. 6 a sectional view showing a longitudinal section taken along a broken line B–B' shown in FIG. 4.

FIG. 4 shows a positional relationship between principal parts of the thermoelectric conversion component of the present embodiment. That is, FIG. 4 is a typical view representing arrangements of principal parts on a plane parallel to a substrate surface, as seen-through from an upper surface of the substrate. FIG. 5 is a sectional view take along a broken line A–A' in FIG. 4, while FIG. 6 shows a sectional view taken along a broken line B–B' in FIG. 4.

Also a basic structure of the thermoelectric conversion component of the present embodiment has a structure referred to as a conventional π-type component, similarly to the embodiment 1. As shown in FIGS. 4, 5 and 6, although the basic structure is similar to that of the thermoelectric conversion component manufactured in the embodiment 1, there are differences in arrangement of electrodes 13 and 14 for performing pn junctions and positional relationship of arrays of elements 15 and 16, or the like and, in addition, the temperature detecting unit is provided by a diffusion resistance 17 instead of a thermistor. Further, there are provided with connecting members 22, 23 for connecting electrodes 18 and 19 for outputting a temperature measurement information from the diffusion resistance 17 formed on the upper substrate 12 with electrodes 20 and 21 for performing connections to the outside, which are provided on the lower substrate 11 in order to perform outputs to the outside of this thermoelectric conversion component. The connecting members 22 and 23 are constitute by a p-type Bi—Te based material which is a material for the thermoelectric elements constituting this thermoelectric conversion component. The connecting members 22 and 23 are manufactured simultaneously with the manufacture of the p-type elements as described below, and are completely integrated in a basic process of manufacturing the thermoelectric conversion component according to the present embodiment.

A method of manufacturing the thermoelectric conversion component having such a structure comprises an upper substrate forming process for forming a temperature detecting portion and electrode layers on the substrate, a lower substrate forming process for forming electrode layers on the opposed substrates, a solder bump forming process for forming solder bumps on a thermoelectric material sintered body, a substrate-thermoelectric material jointing process for jointing the thermoelectric material to the respective substrates, an element forming process for cutting (dicing) the thermoelectric material to form elements on the substrates, and an assembling process for putting together the two substrates respectively having the elements formed thereon.

These processes will be explained in detail hereinbelow.

FIGS. 7A to 7I are a schematic view depicting a method of forming the temperature detecting portion within the upper substrate forming process in the method of manufacturing a thermoelectric conversion component of the present embodiment.

Figure 7A:
FIGS. 7A to 7I are a schematic view representing a process of forming a temperature detecting unit portion on a substrate in the second embodiment.
Figure 7B:
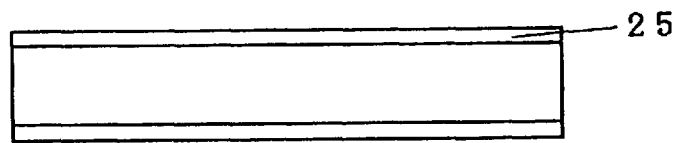
Figure 7C:
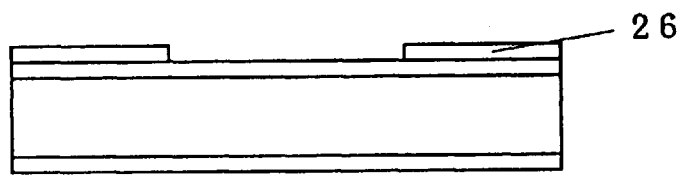
Figure 7D:
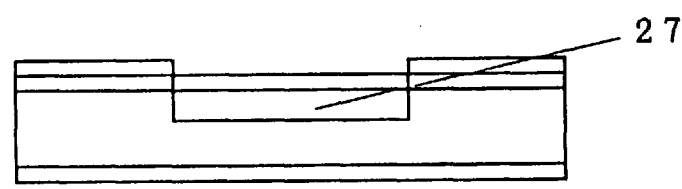
Figure 7E:
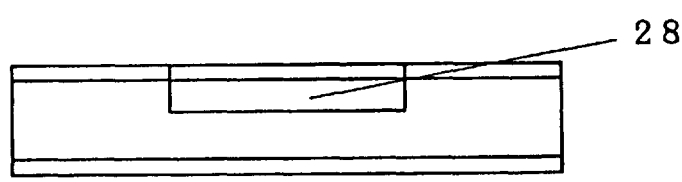

First, a thermal oxide film 25 (FIG. 7B) is formed by thermal oxidation over a surface of a silicon wafer 24 having a specific resistance of 10 kΩcm (FIG. 7A). The one surface having the thermal oxide film 25 on the silicon wafer 24 is masked with a photoresist 26 having an opening at a portion becoming a temperature detecting unit (portion to which a diffusion resistance is to be formed) (FIG. 7C). A size of the opening in the photoresist 26 was made 10 $\mu m \times 200 \mu m$. Then, by ion-implantation process, phosphorus is implanted by a rate of $10^{-13}$ cm$^{-2}$ in order to diffuse an impurity through the photoresist opening. This forms an ion-implanted layer 27 (FIG. 7D). Further, thermal diffusion (950° C.) is carried out in order to remove damages caused by the ion-implantation from the ion-implanted layer 27, thereby forming a diffusion resistance layer 28 (FIG. 7E). This diffusion resistance layer 28 serves as a portion for detecting temperatures, and is formed to a depth of 5000 angstroms.

Figure 7F:
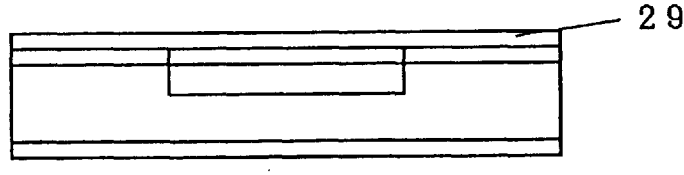
Figure 7G:
Figure 7H:
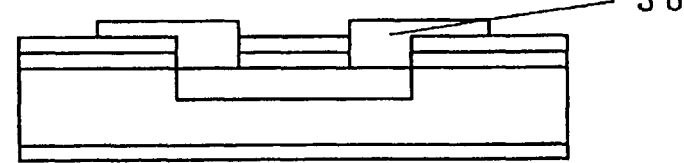
Figure 7I:
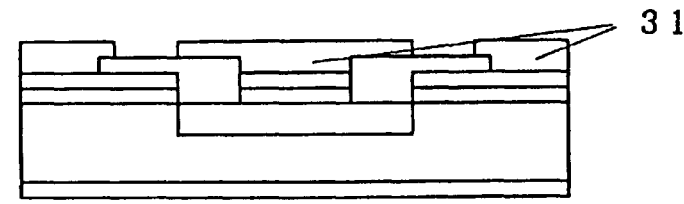

After forming the temperature-detecting diffusion resistance layer 28 in this manner, an SiO$_2$ based protecting layer 29 is formed by a CVD process (FIG. 7F). Further, openings are formed through the SiO$_2$ based protecting layer 29 by photolithography (dry etching process) in order to provide withdrawing electrodes as a temperature detecting unit (FIG. 7G). Over the openings and the SiO$_2$ based protecting layer 29 surrounding these openings, aluminum electrodes 30 are formed by a sputtering process and photolithography (FIG. 7H). Further, a silicon-nitride based protecting layer 31 is formed by a CVD process so as to expose only externally-connecting portions of the aluminum electrodes 30 (FIG. 7I).

Here, the diffusion resistance 28 formed in 200 µm length becomes to have a substantial resistance length of 100 µm, because the aluminum electrodes 30 are formed so as to be connected thereto. In this manner, a temperature detecting unit by a diffusion resistance could be made, which was 100 µm in length, 10 µm in width and 0.5 µm in depth and had a resistance of 400 kΩ.

Figure 8A:
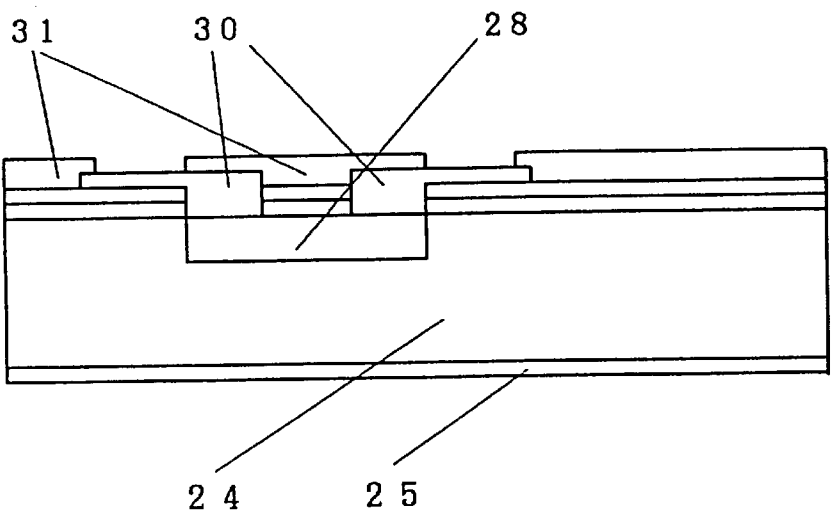
FIGS. 8A to 8C are a schematic view representing a process of working the substrate having a temperature detecting unit into an upper substrate of a thermoelectric conversion component.
Figure 8B:
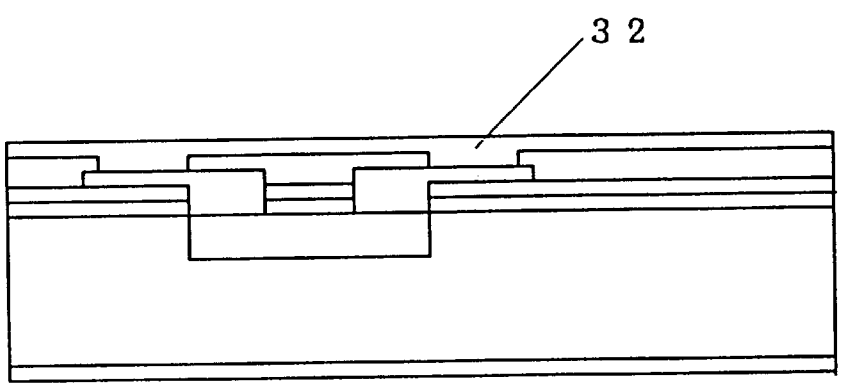
Figure 8C:
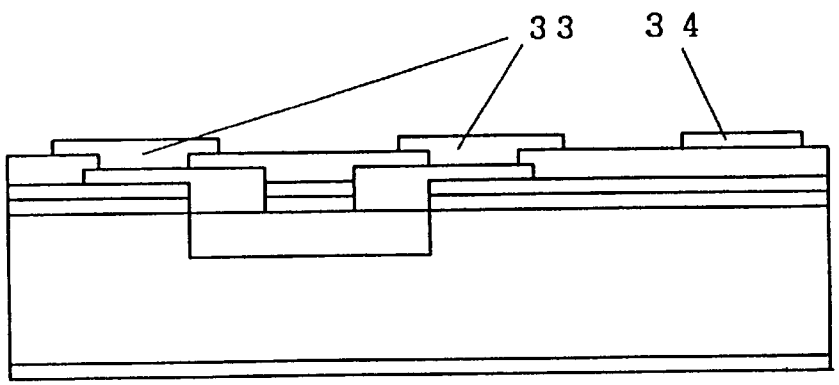

FIGS. 8A to 8C show a process for making the silicon wafer having the temperature detecting unit thus manufactured as the upper substrate 12 in the thermoelectric conversion component shown in FIG. 5. First, a layer 32 consisting of three layers of Cr, Ni and Au in the order from a wafer side is formed onto the silicon wafer, on which the temperature detecting unit has been formed (FIG. 8A), by sputtering process (FIG. 8B). This layer 32 not only becomes a layer for constituting the upper pn jointing electrodes 14 in FIGS. 4 and 5 but also protects the aluminum electrodes 30 exposed by the openings in the temperature detecting unit portion and simultaneously functions as diffusion-resistance temperature detecting unit electrodes 18, 19.

Although the photolithographic process was adopted as the method of forming each electrode consisting of these three layers, each portion was structured as mentioned below. Electrodes 33 were formed so as to completely cover the aluminum electrodes 30 at the openings for the aluminum electrodes 30 and areas surrounding the openings (on the silicon-nitride protecting layer 31). Further, an upper pn jointing electrode 34 was formed so as to become a pattern of the upper pn jointing electrode 14 on the upper substrate 12 shown in FIG. 4 (FIG. 8C).

Figure 9A:
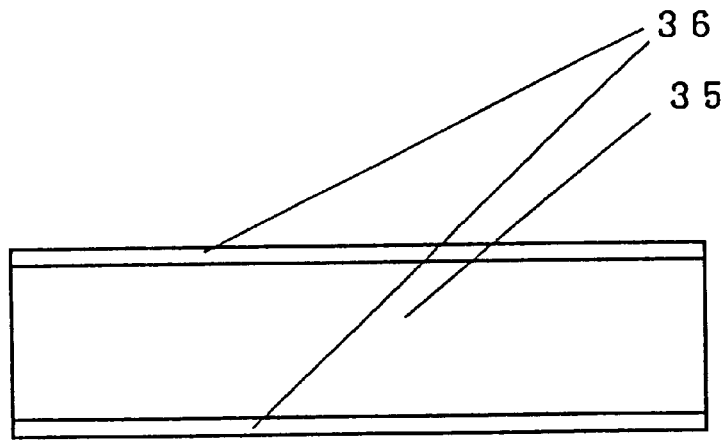
FIGS. 9A to 9C are a schematic view representing a process of forming a lower substrate in the second embodiment.
Figure 9B:
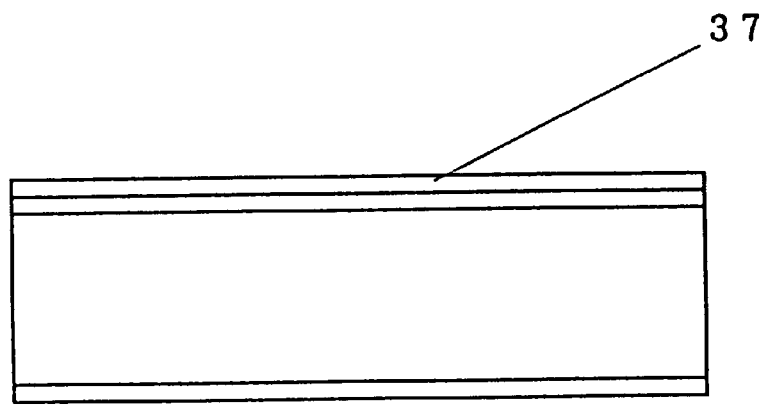
Figure 9C:
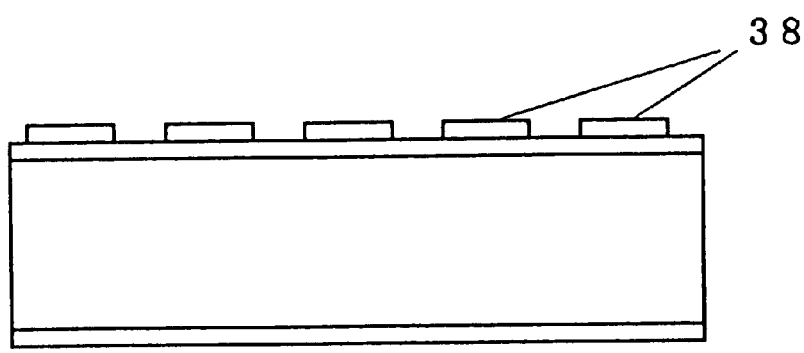

Now, the lower substrate forming process will be explained with reference to FIGS. 9A to 9C. As the lower substrate, a silicon wafer 35 having a thermal oxide layer 36 formed over a surface thereof was used (FIG. 9A). First, a layer 37 consisting of three layers of Cr, Ni and Au in the order from a substrate side is formed by sputtering (FIG. 9B). Then, lower pn jointing electrodes 38 were formed by photo-etching so as to become a pattern to which there was added a pattern of the connecting electrodes 20 and 21 for connection to the temperature detecting unit and external connection, in addition to the lower substrate electrode pattern 11 shown in FIG. 4 and FIG. 5 (FIG. 9C).

Next, explanations will be made about the solder bumps forming process onto a Bi—Te based thermoelectric material sintered body, with reference to FIGS. 10A to 10F. Incidentally, this solder bump forming process is common to the p-type and n-type thermoelectric materials.

Figure 10A:
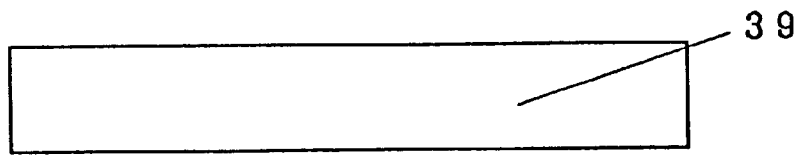
FIGS. 10A to 10F are a schematic view representing a process of forming solder bumps on a Bi—Te based thermoelectric material sintered body in the second embodiment.
Figure 10B:
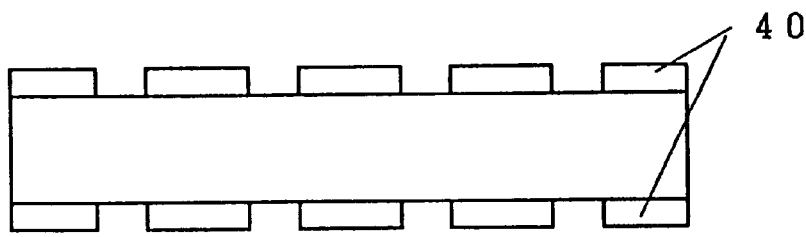
Figure 10C:
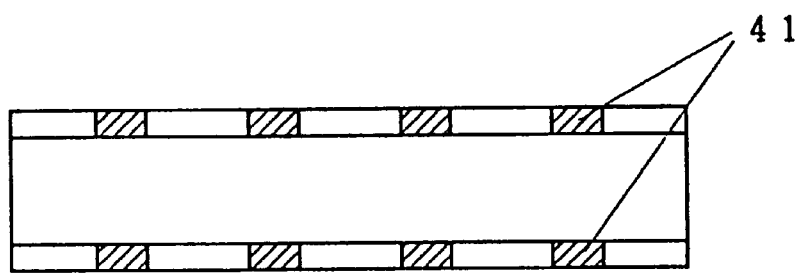
Figure 10D:
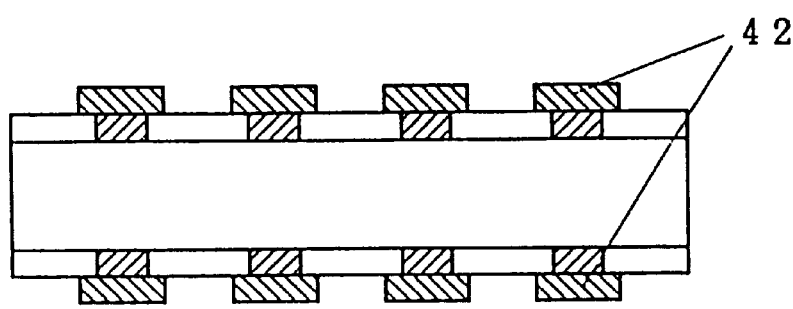
Figure 10E:
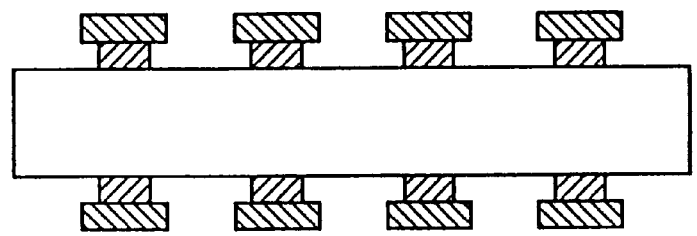
Figure 10F:
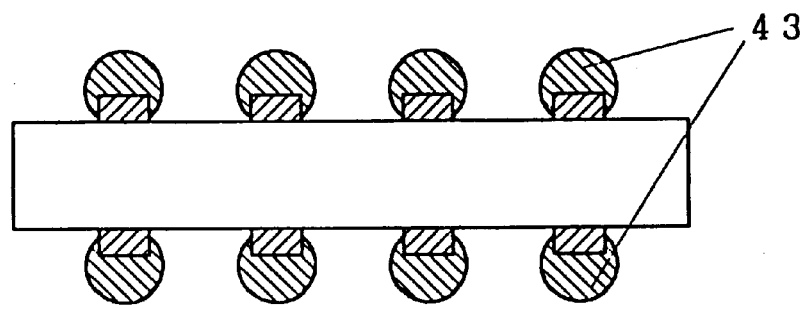

A photoresist layer 40, which has a thickness of 40 µm and circular openings each of which is 110 µm in diameter and whose distance between centers is 320 µm, is formed on respective surface of a plate-like Bi—Te based thermoelectric sintered body 39 (FIG. 10A) polished to a thickness of 600 µm (FIG. 10B). At this time, a double-side aligner was utilized so as to accurately align the openings at the respective surface. Next, Ni bumps 41 were formed in these openings by a wet plating method to a thickness of 40 µm that is the same as the thickness of the photoresist layer 40 (FIG. 10C). Further, a solder (Sn:Pb=6:4) plating 42 aimed to become solder bumps was formed to a thickness of 30 µm by a wet solder plating method (FIG. 10D). Thereafter, the photoresist is stripped away (FIG. 10E), a rosin-based solder flux is applied to the solder plating 42 and the solder plating 42 is subjected to reflowing by passing through a reflow furnace heated to and set at 250° C. As a result, generally-spherical solder bumps 43 each of which had a Ni-bump "base" and a height of 100 µm could be formed at a pitch of 320 µm (FIG. 10F). The thermoelectric material thus formed with solder bumps on the respective surface was cut by using a dicing device in such a manner that it had the solder bumps 43 in the number of 7×8 (on one surface), thus providing an element sample used in one thermoelectric conversion component. This thermoelectric material having solder bumps of 7×8, i.e. 56, on one surface is formed, at portions having the bumps, into elements by way of the processes described below. For the portion shown by the broken line A–A' in FIG. 4, however, some elements having no direct relation to thermoelectric conversion are formed. Of these elements having no direct relation to thermoelectric conversion, the elements positioned at 22 and 23 in FIG. 4 are utilized as jointing members, thereby respectively connecting the upper-substrate electrodes 18, 19 with the lower-substrate electrodes 20, 21.

Next, the substrate-thermoelectric material jointing step will be explained with reference to a schematic view shown in FIG. 11. Incidentally, since this step is performed irrespective of whether the thermoelectric material is p-type or n-type, it is explained about one type (the case that the p-type thermoelectric material is jointed to the lower substrate will be exemplified).

First, alignment is performed, by using a jig, between the lower substrate 44 formed in the lower substrate forming step and an element-forming p-type thermoelectric material 45 on whose both surfaces the bumps have been formed. That is, the lower pn jointing electrodes 46 of the lower substrate 44 are aligned with the solder bumps 47. Under this state, they were heated at 250° C. to joint the substrate and the thermoelectric material. At this time, junctions are performed also for the solder bumps located at the elements for respectively connecting the upper-substrate electrodes 18, 19 and the lower-substrate electrodes 20, 21 as stated before, besides the junctions related to thermoelectric conversion. In the jointing, between the lower substrate 44 and the thermoelectric material 45 there is a gap owing to the existence of the Ni bumps (40 µm in height) formed on the thermoelectric material 45, which gap has almost an equal dimension to that height (40 µm). By utilizing the gap, the elements jointed to the substrate are manufactured in such a manner as explained below.

Figure 11:
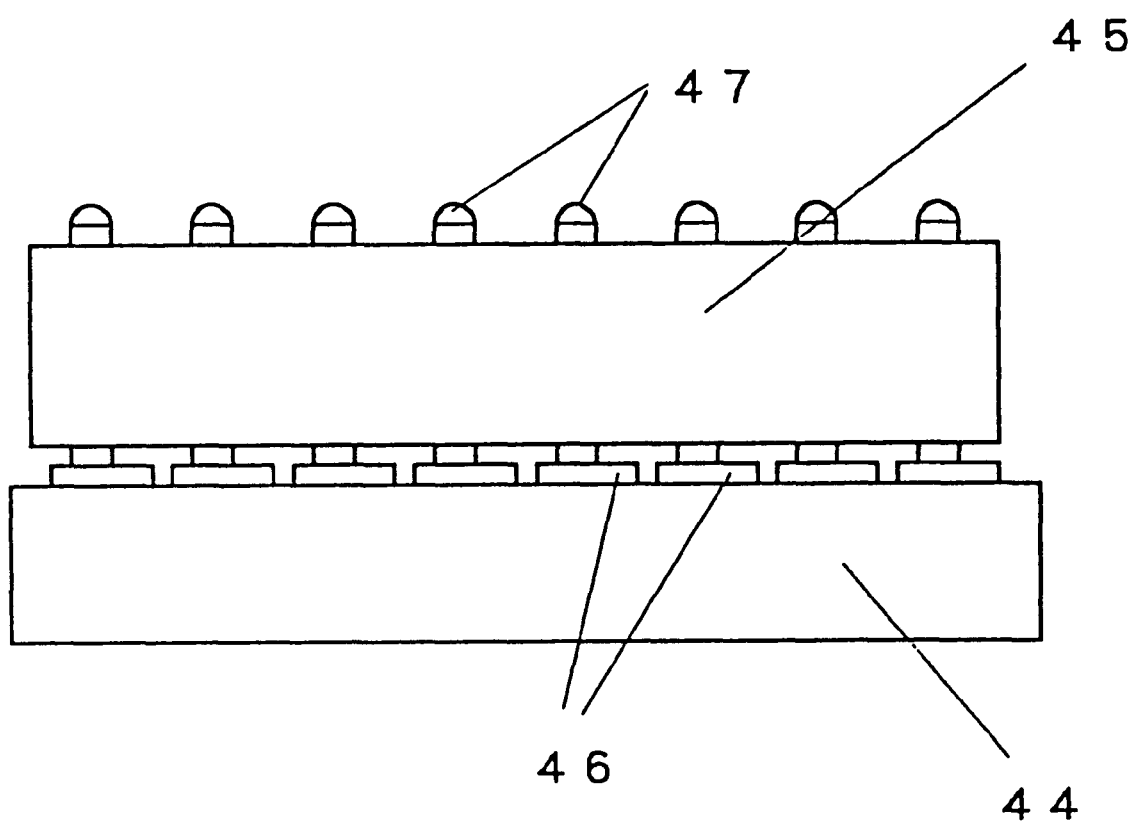
FIG. 11 is a view showing a state that a thermoelectric material is jointed to a substrate in the second embodiment.
Figure 12:
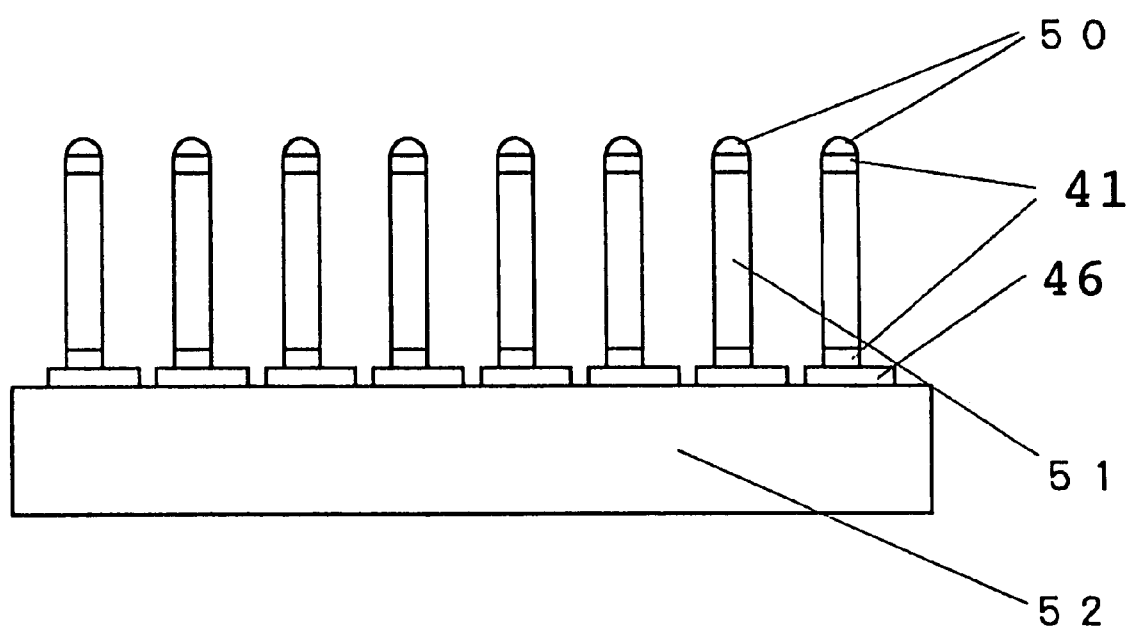
FIG. 12 is a view showing a state that the elements having solder bumps are jointed to a substrate.

For the substrate jointed with the thermoelectric material as shown in FIG. 11, a dicing blade with a cutting edge thickness of 200 µm is attached to a dicing device used for cutting a silicon semiconductor or the like into chips. The cutting edge is positioned so as not to cut the silicon substrate 44 or the pn jointing electrodes 46, by utilizing the 40-µm gap formed by the Ni bumps existing between the lower substrate 44 and the thermoelectric material 45. Only the thermoelectric material 45 between the solder bumps is cut. This provides a substrate 52 jointed with the elements 51 having solder bumps 50, as shown in FIG. 12. The lower substrate jointed with the p-type elements is manufactured in this manner. At this time, the connecting members 22 and 23 are simultaneously formed in a state of being jointed to the lower substrate. It is also possible to manufacture an upper substrate jointed with n-type elements in a similar manner.

Incidentally, the substrate jointed with the elements may be manufactured in a size for one thermoelectric conversion component. Alternatively, such a substrate may be formed in a size for a plurality of the component so that the silicon substrate is cut to one thermoelectric conversion component.

Next, the final process of putting together (assembling) the two substrates each jointed with elements will be explained with reference to FIGS. 13A and 13B.

Figure 13A:
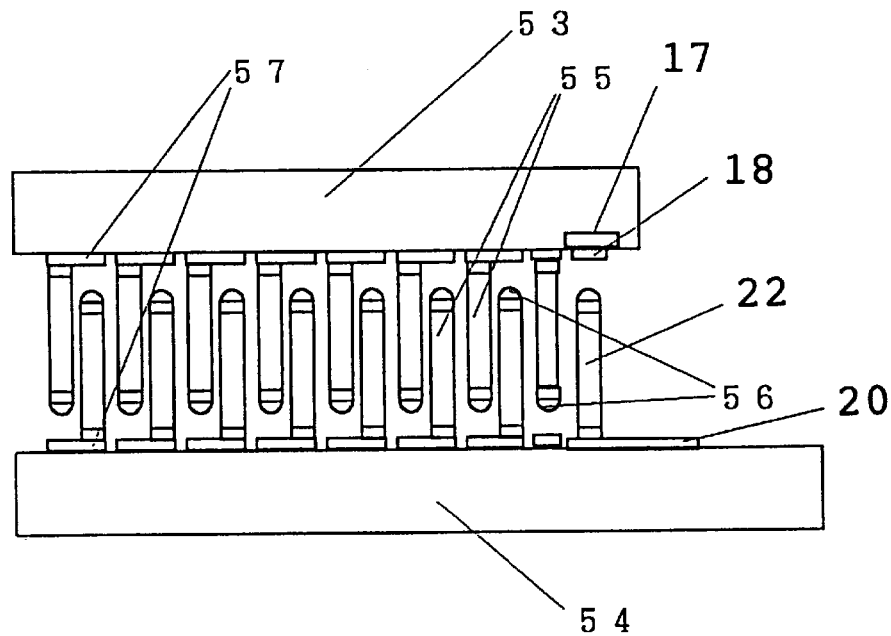
FIGS. 13A and 13B are a schematic view representing a process of putting together (assembling) two substrates each having elements in the second embodiment.
Figure 13B:
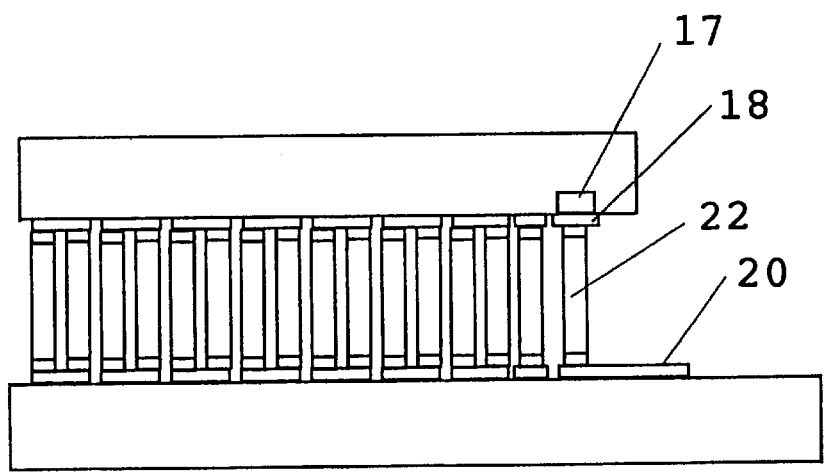

As shown in FIG. 13A, the upper substrate 53 and the lower substrate 54 are placed under a state that their surfaces on which elements 55 have been jointed are oppositely faced each other. Simultaneously, the solder bumps 56 at the tips of the elements are aligned with the pn jointing electrodes 57 of the opposite substrates so that appropriate pressure is externally applied to the substrates and the entire portion is heated at 250° C. In this manner, the elements and the substrate opposite thereto were jointed to thereby manufacture an aimed thermoelectric conversion component (FIG. 13B). Incidentally, in FIG. 13B the element pair forming pn junctions with the upper substrate is depicted as if it is formed with pn junctions, in the same pair, at also the lower substrate. However, this is because the same figure outlines the arrangement of the elements, etc. in a longitudinal sectional view taken in a perpendicular direction to this in FIG. 4 wherein the elements, etc. of the thermoelectric device of the present embodiment are seen through the substrate surface. Therefore, it is needless to say that an element formed with a pn junction on the upper substrate has a pn junction with another element on the lower substrate.

During jointing between the elements and the substrates, the connecting members 22 and 23 in FIG. 4 and FIG. 5 could be simultaneously jointed, thereby enabling a temperature measurement information of the diffusion-resistance temperature detecting unit to be withdrawn through the electrodes 20 and 21 to the outside.

The thermoelectric conversion component of the present embodiment thus manufactured, that is, the thermoelectric conversion component constituted by the silicon substrate having the temperature detecting unit utilizing the diffusion resistance, had such performances as mentioned below.

Figure 14:
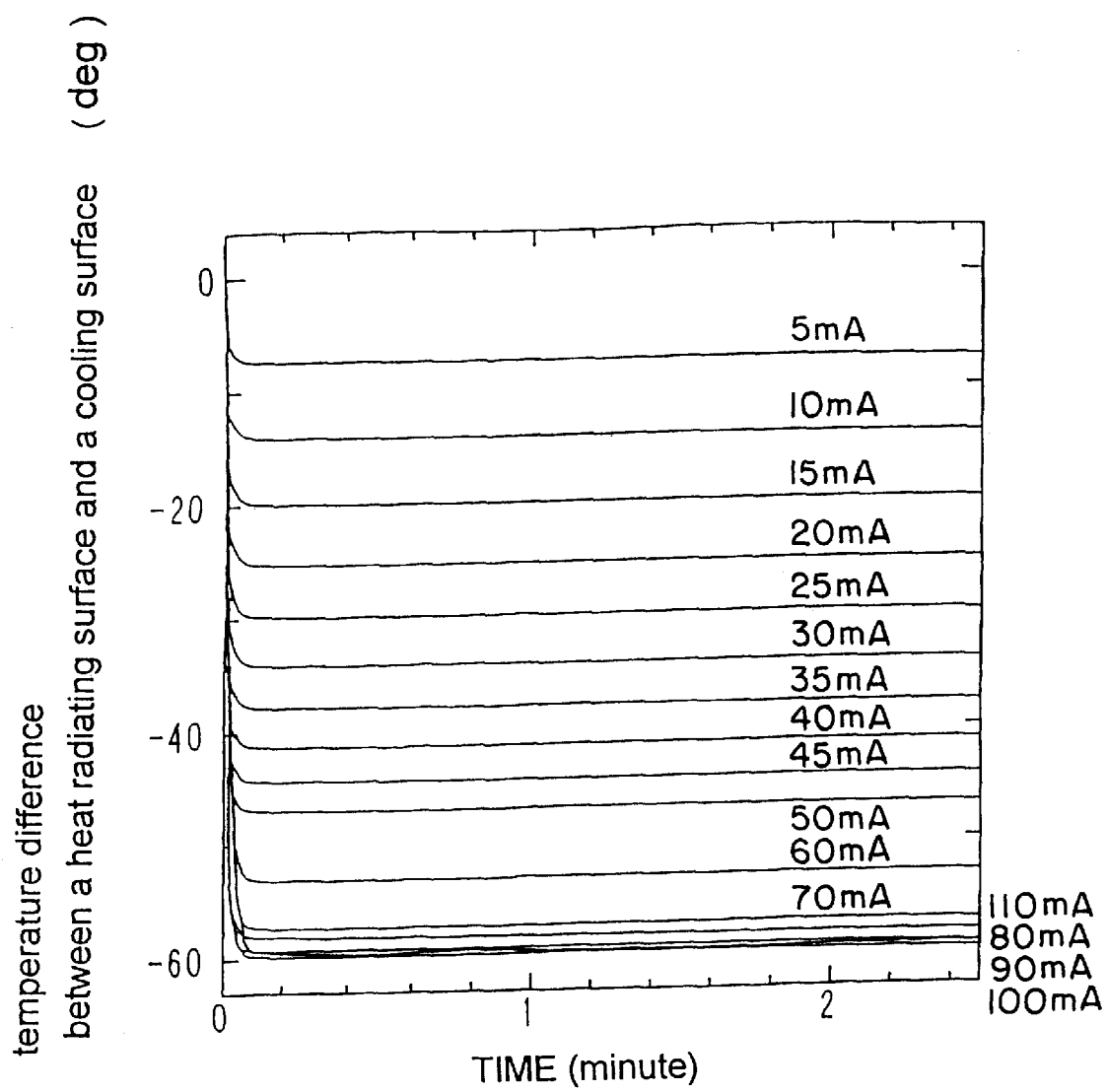
FIG. 14 is a diagram showing a result of measuring temperature differences, with respect to each current value, between a heat radiating surface and a cooling surface by using a temperature detecting unit utilizing a diffusion resistance.

Measurements were made on the temperature difference between a surface (cooling surface) of the upper substrate and the lower substrate with respect to respective current values by the temperature detecting unit utilizing the diffusion resistance formed in the upper substrate, with the temperature at a surface (heat radiating surface) of the lower substrate kept constant at 30° C. The results of the measurements are shown in FIG. 14. Since the present embodiment utilizes the thermoelectric conversion component for cooling, the temperature detecting unit is preferably placed at the cooling surface.

It can be read from this figure that the maximum temperature difference is 60° C. when the current vale is 80–100 mA. It is also understood that for each current value it takes about 3 seconds to reach a steady state from a start of current supply. Meanwhile, a chip-formed thermistor was adhesion-mounted on this thermoelectric conversion component to conduct similar measurements. The maximum temperature difference was obtained at the current value of 80 mA, where in the temperature difference of 53° C. was exhibited with the thermistor while the temperature difference of 60° C. was exhibited with the temperature detecting unit utilizing the diffusion resistance. Also, the time period from a start of current supply to reach a steady state greatly varied by each current value, wherein it was 5–15 seconds with the thermistor while it was 5–12 seconds with the diffusion-resistance temperature detecting unit.

As the above, it is understood that, where the thermoelectric conversion component is adhesion-attached with a thermistor (conventional case), the thermistor itself acts as a thermal load and accordingly the thermoelectric conversion component cannot exhibit its inherent performances. Therefore, where an object to be cooled is mounted on the thermoelectric conversion component as conventionally done, there is a necessity of taking the thermal load of the thermistor into consideration. It could be confirmed again that the conventional one involves such defects that requires a thermoelectric conversion component having a capacity greater than that inherently required by the thermoelectric conversion component. Since the thermoelectric conversion component manufactured by the present embodiment is not mounted with a chip part, such as a thermistor, giving rise to a thermal load, it becomes unnecessary to apply a thermoelectric conversion component having unnecessarily great capacity to an object to be cooled. It was confirmed at the same time that a highly stable cooling state could be produced.

Incidentally, it was explained in the embodiments 1 and 2 that the temperature detecting unit was formed on the upper substrate (cooling surface). However, needless to say, in the thermoelectric conversion component there is no definition, concerning the upper and lower. Also, the cooling surface and the heat radiating surface can arbitrarily be altered by changing the direction of current supply. Further, although the temperature detecting unit was formed on only one of the substrates, it is needless to say that it may be formed on both substrates, as required.

In a thermoelectric conversion component having a p-type thermoelectric material element and an n-type thermoelectric material element sandwiched between two substrate, a temperature detecting unit is integrally formed with at least one of the substrates constituting this thermoelectric conversion component. Therefore, since there is no necessity of mounting as the temperature detecting unit a chip part such as a thermistor which imposes a thermal load, it becomes unnecessary to apply an unnecessarily large thermoelectric conversion component to an object to be cooled and at the same time a highly stable cooling state can be produced.

A temperature detecting unit is integrally formed with at least one of the substrates, and a surface of the substrate formed with the temperature detecting unit is a side on which the elements consisting of a thermoelectric material are sandwiched between the substrates. It is therefore possible to connect, by a conductive connecting member, an electrode directly formed in the temperature detecting unit on a side connected with the elements (in other words, inner side of thermoelectric conversion component) with and an external equipment-connecting electrode formed on a surface opposite to the former electrode. By the connection like this, it is possible to obtain such a structure that the connection between the temperature detecting unit and the external equipment can be performed by using the temperature detecting unit, i.e. the substrate opposite to the substrate to be temperature-controlled. Therefore, an unnecessary wiring and a thermal load are not applied to the temperature controlled surface.

Where the connecting member for connecting between the electrode directly formed on the temperature detecting unit and the external equipment-connecting electrode formed on the opposite surface (substrate) is made of a same material as a thermoelectric material used for this thermoelectric conversion component, it is possible to reduce the flow of heat. Accordingly, the performance is prevented from lowering. At the same time, there is no necessity of fabricating a special connecting member, thereby giving advantages in respect of cost.

Where the electrically-conductive material used for this connecting member is made electrically insulated from elements consisting of a thermoelectric material used as a thermoelectric conversion in the thermoelectric conversion component, there is eliminated an influence by the current flowing through the thermoelectric conversion component.

Where a thermoelectric material used for the connecting member is all the same in a same semiconductor characteristic type, it is possible to eliminate a thermoelectromotive force occurring due to a temperature difference, thereby raising measuring accuracy.

Where the thermoelectric material used for the connecting member is same in shape as that of elements consisting of a thermoelectric material used for thermoelectric conversion in the thermoelectric conversion component, it is possible to use elements made through a common means in the manufacturing process, thereby giving advantages in respect of cost.

Also, where the temperature detecting unit integrally formed with the thermoelectric conversion component is made by a thermistor directly and integrally formed, by a thin or thick film process, with the substrate, the temperature detecting unit can be formed at an arbitrary position on an alumina substrate or an insulation-applied silicon substrate with low cost.

Further, where a silicon substrate having an insulating layer formed on a surface is used as the substrate for the thermoelectric conversion component and the temperature detecting unit is made so as to utilize a silicon semiconductor characteristic, it is possible to manufacture a high-performance ultra-small thermoelectric conversion component having a temperature detecting unit, which cannot be made by the conventional method.

As stated above, the thermoelectric conversion component according to the present invention is effective particularly as a small-sized thermoelectric conversion component. For example, a semiconductor laser used in optical communications requires cooling of its heat generation by a thermoelectric conversion component. However, the thermoelectric conversion component used therefor is small, i.e. a several-mm square, so that mounting of a temperature controlling sensor or the like results in adverse effect on the size or cooling performance. Accordingly, there have been problems in respect of reduction in entire size and power consumption. However, the thermoelectric conversion component of the present invention drastically improves these problems.

What is claimed is:

1. A thermoelectric conversion component comprising:
   a p-type thermoelectric material element and an n-type thermoelectric material element;
   a pair of substrates disposed in an opposing relation with respect to each other so as to sandwich therebetween the p-type thermoelectric material element and the n-type thermoelectric material element;
   electrodes provided on respective inner surfaces of the substrates so that the p-type thermoelectric material element and the n-type thermoelectric material element form a pn junction; and
   a temperature detecting component having a film integrally formed on an inner surface of at least one of the substrates.

2. A thermoelectric conversion component according to claim 1; further comprising an input/output electrode formed on the temperature detecting component, a second electrode for withdrawing an output of the temperature detecting component outside the thermoelectric conversion component, the second electrode being formed on the substrate opposite the substrate on which the temperature detecting component is formed, and a connecting element formed of an electrically conductive material for connecting the input/output electrode and the second electrode.

3. A thermoelectric conversion component according to claim 2; wherein the same electrically conductive material used to form the connecting element is used to form the thermoelectric material elements.

4. A thermoelectric conversion component according to claim 3; wherein the electrically conductive material forming the connecting element is electrically insulated from other elements formed of a thermoelectric material in the thermoelectric conversion component.

5. A thermoelectric conversion component according to claim 3; wherein the electrically conductive material used to form the connecting element is the same type in semiconductor characteristic as a thermoelectric material used for said thermoelectric material elements.

6. A thermoelectric conversion component according to claim 3; wherein a shape of the electrically conductive material used to form the connecting element is the same as that of the thermoelectric material elements.

7. A thermoelectric conversion component according to claim 1; wherein the temperature detecting component is a thermistor.

8. A thermoelectric conversion component according to claim 1; wherein the substrate on which the temperature detecting component is formed comprises a silicon substrate having a surface on which is formed an insulating layer, and wherein the temperature detecting component comprises a doped region of the silicon substrate which detects temperature based on silicon semiconductor characteristics.

9. A thermoelectric conversion component comprising:
   a plurality of p-type thermoelectric material elements and n-type thermoelectric material elements;
   a pair of substrates disposed in an opposing relation with respect each other so as to sandwich therebetween the p-type thermoelectric material elements and the n-type thermoelectric material elements;
   electrodes provided on respective inner surfaces of the substrates so that pairs of the p-type thermoelectric material elements and the n-type thermoelectric material elements form a pn junction;
   a temperature detecting component integrally formed on an inner surface of at least one of the substrates;
   an input/output electrode formed on the temperature detecting component;
   a second electrode for withdrawing an output of the temperature detecting component outside the thermoelectric conversion component, the second electrode being formed on the substrate opposite the substrate on which the temperature detecting component is formed; and
   a connecting element formed of an electrically conductive material for connecting the input/output electrode and the second electrode.

10. A thermoelectric conversion component according to claim 9; wherein the same electrically conductive material used to form the connecting element is used to form the thermoelectric material elements.

11. A thermoelectric conversion component according to claim 10; wherein the electrically conductive material forming the connecting element is electrically insulated from other elements formed of a thermoelectric material in the thermoelectric conversion component.

12. A thermoelectric conversion component according to claim 11; wherein the electrically conductive material used to form the connecting element is a semiconductor material having the same characteristics as a semiconductor material used to form the thermoelectric material elements.

13. A thermoelectric conversion component according to claim 11; wherein a shape of the electrically conductive material used to form the connecting element is the same as that of the thermoelectric material elements.

14. A thermoelectric conversion component according to claim 9; wherein the temperature detecting component is a thermistor.

15. A thermoelectric conversion component according to claim 9; wherein the substrate on which the temperature detecting component is formed comprises a silicon substrate having a surface on which there is formed an insulating layer, and wherein the temperature detecting component comprises a doped region of the silicon substrate which detects temperature based on silicon semiconductor characteristics.

16. A thermoelectric conversion component comprising:
    a p-type thermoelectric material element and an n-type thermoelectric material element;
    a pair of substrates disposed in an opposing relation with respect each other so as to sandwich therebetween the p-type thermoelectric material element and the n-type thermoelectric material element;
    electrodes provided on respective inner surfaces of the substrates so that the p-type thermoelectric material element and the n-type thermoelectric material element form a pn junction; and
    a temperature detecting component having a thin film thermistor directly formed on an inner surface of at least one of the substrates.

17. A thermoelectric conversion component according to claim 16; further comprising an input/output electrode formed on the temperature detecting component, a second electrode for withdrawing an output of the temperature detecting component outside the thermoelectric conversion component, the second electrode being formed on the substrate opposite the substrate on which the temperature detecting component is formed, and a connecting element formed of an electrically conductive material for connecting the input/output electrode and the second electrode.

18. A thermoelectric conversion component according to claim 17; wherein the same electrically conductive material used to form the connecting element is used to form the thermoelectric material elements.

19. A thermoelectric conversion component according to claim 18; wherein the electrically conductive material forming the connecting element is electrically insulated from other elements formed of a thermoelectric material in the thermoelectric conversion component.

20. A thermoelectric conversion component according to claim 19; wherein the electrically conductive material used to form the connecting element is a semiconductor material having the same characteristics as a semiconductor material used to form the thermoelectric material elements.

21. A thermoelectric conversion component according to claim 19; wherein a shape of the electrically conductive material used to form the connecting element is the same as that of the thermoelectric material elements.

22. A thermoelectric conversion component according to claim 16; wherein the substrate on which the temperature detecting component is formed comprises a silicon substrate having a surface on which there is formed an insulating layer and wherein the temperature detecting component comprises a doped region of the silicon substrate which detects temperature based on silicon semiconductor characteristics.

23. A thermoelectric conversion component comprising:
    a p-type thermoelectric material element and an n-type thermoelectric material element;
    a pair of substrates disposed in an opposing relation with respect to each other so as to sandwich therebetween the p-type thermoelectric material element and the n-type thermoelectric material element;
    electrodes provided on respective inner surfaces of the substrates so that the p-type thermoelectric material element and the n-type thermoelectric material element form a pn junction; and
    a temperature detecting component integrally formed on an inner surface of at least one of the substrates;
    wherein the substrate on which the temperature detecting component is formed comprises a silicon substrate surface on which there is formed an insulating layer, and wherein the temperature detecting component comprises a doped region of the silicon substrate which detects temperature based on silicon semiconductor characteristics.

* * * * *